United States Patent
Lee

(10) Patent No.: US 7,193,897 B2
(45) Date of Patent: Mar. 20, 2007

(54) NAND FLASH MEMORY DEVICE CAPABLE OF CHANGING A BLOCK SIZE

(75) Inventor: Ju Yeab Lee, Kyeongki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/182,566

(22) Filed: Jul. 15, 2005

(65) Prior Publication Data
US 2006/0140001 A1 Jun. 29, 2006

(30) Foreign Application Priority Data
Dec. 28, 2004 (KR) ............. 10-2004-0114138

(51) Int. Cl.
*G11C 11/34* (2006.01)
*G11C 16/04* (2006.01)

(52) U.S. Cl. ............ 365/185.17; 365/185.18; 365/185.11; 365/230.03

(58) Field of Classification Search ....... 365/185.18, 365/185.11, 230.03, 185.17
See application file for complete search history.

(56) References Cited

U.S. PATENT DOCUMENTS

| | | | | |
|---|---|---|---|---|
| 6,262,926 B1* | 7/2001 | Nakai | ................. | 365/200 |
| 6,370,062 B2* | 4/2002 | Choi | ................. | 365/185.23 |
| 7,035,143 B2* | 4/2006 | Lee | ................. | 365/185.17 |
| 7,057,915 B2* | 6/2006 | Futatsuyama | ............. | 365/63 |
| 2006/0050594 A1* | 3/2006 | Park | ................. | 365/230.05 |
| 2006/0083062 A1* | 4/2006 | Park | ................. | 365/185.11 |

* cited by examiner

*Primary Examiner*—Amir Zarabian
*Assistant Examiner*—Kretelia Graham
(74) *Attorney, Agent, or Firm*—Marshall, Gerstein & Borun LLP

(57) ABSTRACT

Disclosed herein is a NAND flash memory device capable of changing a block size. In NAND flash memory devices capable of changing a block size, each memory block is divided into two page groups. Each memory block includes two block switches to select each page group in response to an external address signal. During an erasing operation, the block size is easily variable by applying an erasure voltage to one or two page groups.

12 Claims, 2 Drawing Sheets

NAND FLASH MEMORY DEVICE CAPABLE OF CHANGING A BLOCK SIZE

BACKGROUND OF THE INVENTION

1. Field of the Disclosure

The present invention relates to NAND flash memory devices and, more specifically, to a NAND flash memory device capable of changing a block size by dividing a single block into two blocks.

2. Description of Related Technology

A memory cell array embedded in a NAND flash memory device includes a number of memory blocks, each block including a plurality of memory strings. Each string is constructed of a drain selection transistor connected to a bitline, a source selection transistor connected to a common source line, and a plurality of memory cells connected between the selection transistors serially.

The string is sized in a regularized dimension with 16 or 32 memory cells. Thus, a size of the memory block is determined in a constant dimension.

In typical NAND flash memory devices, a programming or reading operation is carried out in the unit of page, while an erasing operation is carried out in the unit of block (or sector). In other words, an erasing operation erases all memory cells belonging to a block of the constant size.

However, because the design of the memory array and peripheral circuits may need to be modified when reducing the block size, such changes to the block size may be problematic.

SUMMARY OF THE DISCLOSURE

Disclosed is a NAND flash memory device capable of changing a block size by dividing each memory block into two page groups, each memory block having two block switches to select each page group in response to an external address signal, such that during an erasing operation, an erasure voltage is applied to one or two page groups.

In accordance with one aspect of the disclosure, a NAND flash memory device includes: a memory block divided into first and second page groups; first and second switching circuits connected each between the first and second page groups and a global line to transfer operating voltages to the first and second page groups, respectively; a block division selector outputting a division signal for determining to activate one or both of the first and second page groups; a page group selection controller outputting the first and second selection signals in the same level or in different levels in response to a page selection address signal and an erasing signal; and, first and second block switching circuits each controlling the first and second switching circuits in response to the first and second selection signals, respectively, and a block selection address signal. In accordance with the division signal, all memory cells included in the memory block are erased, or memory cells included in the first or second page group are independently erased.

The memory block may be one of a plurality of memory blocks, and the plurality of memory blocks may be provided with a corresponding number of respective switching circuits and a corresponding number of respective block switching circuits.

In some embodiments, the first page group includes a drain selection line and first through sixteenth wordlines, while the second page group includes seventeenth through thirty-second wordlines and a source selection line.

The page group selection controller may receive an address signal corresponding to the most significant bit of an external address signal to select a page of a respective memory block, such that the address signal may include a page selection address signal.

The first switching circuit may include a plurality of switching elements controlled by the first block switching circuit, each of which is connected to a drain selection line and first through sixteenth wordlines, included in the first page group, and transferring an operating voltage from a global line to the drain selection line and the first through sixteenth wordlines. Alternatively, or in addition, the second switching circuit may include a plurality of switching elements controlled by the second block switching circuit, each of which is connected to first through sixteenth wordlines and a source selection line, included in the second page group, and transferring an operating voltage from a global line to the first through sixteenth wordlines and the source selection line.

In some cases, the block division selector includes a resistor element and a fuse that are connected between a power source voltage terminal and a ground voltage terminal in series, the division signal being output from a node connected to the resistor element and the fuse. In such cases, a cut-off state of the fuse may determine whether to activate one of both of the first and second page groups. The resistor element may be connected between the power source voltage terminal and the fuse and may have a gate connected to the ground voltage terminal. The resistor element may include a PMOS transistor having a predetermined on-resistance value.

The page group selection controller may include a first NAND gate outputting the first selection signal in accordance with the erasing signal, the division signal, and the page selection address signal, an inverter to invert the page selection address signal, and a second NAND gate outputting a second selection signal in accordance with the erasing signal, the division signal, and a signal generated by the inverter.

In some embodiments, the first block switching circuit includes a logic circuit logically combining the block selection address signal and the first selection signal, an inverter to invert an output signal of the logic circuit, a first NMOS transistor connected between the inverter and an output terminal to receive a power source voltage through a gate, a second NMOS transistor connected between the output terminal and a ground voltage terminal and responsive to an output signal of the inverter, third and fourth NMOS transistors connected between the output terminal and a high voltage terminal in series, each of which receives a block selection signal to select the memory block during a precharging operation, and first and second diodes connected between the high voltage terminal and the output terminal in series.

Alternatively, or in addition, the second block switching circuit may include a logic circuit logically combining the block selection address signal and the second selection signal, an inverter to invert an output signal of the logic circuit, a first NMOS transistor connected between the inverter and an output terminal to receive a power source voltage through a gate, a second NMOS transistor connected between the output terminal and a ground voltage terminal and responsive to an output signal of the inverter, third and fourth NMOS transistors connected between the output terminal and a high voltage terminal in series, each of which receives a block selection signal to select the memory block during a precharging operation, and first and second diodes connected between the high voltage terminal and the output terminal in series.

BRIEF DESCRIPTION OF THE DRAWINGS

The accompanying drawings are included to provide further details regarding the disclosure, and are incorporated in and constitute a part of this specification. The drawings illustrate exemplary embodiments of the disclosure and, together with the description, also serve to set forth principles, features and aspects of the disclosure. In the drawings.

DETAILED DESCRIPTION OF PREFERRED EMBODIMENTS

A number of embodiments of the disclosure will be described below in more detail with reference to the accompanying drawings. The disclosure may, however, be embodied in different forms and should not be considered to be limited to the embodiments set forth herein. Rather, the exemplary nature of these embodiments will fully convey the scope of the appended claims to those skilled in the art. hi the drawings, the thickness of layers and regions may be exaggerated for clarity. Further, numerals refer to like elements throughout the specification.

Figure 1:
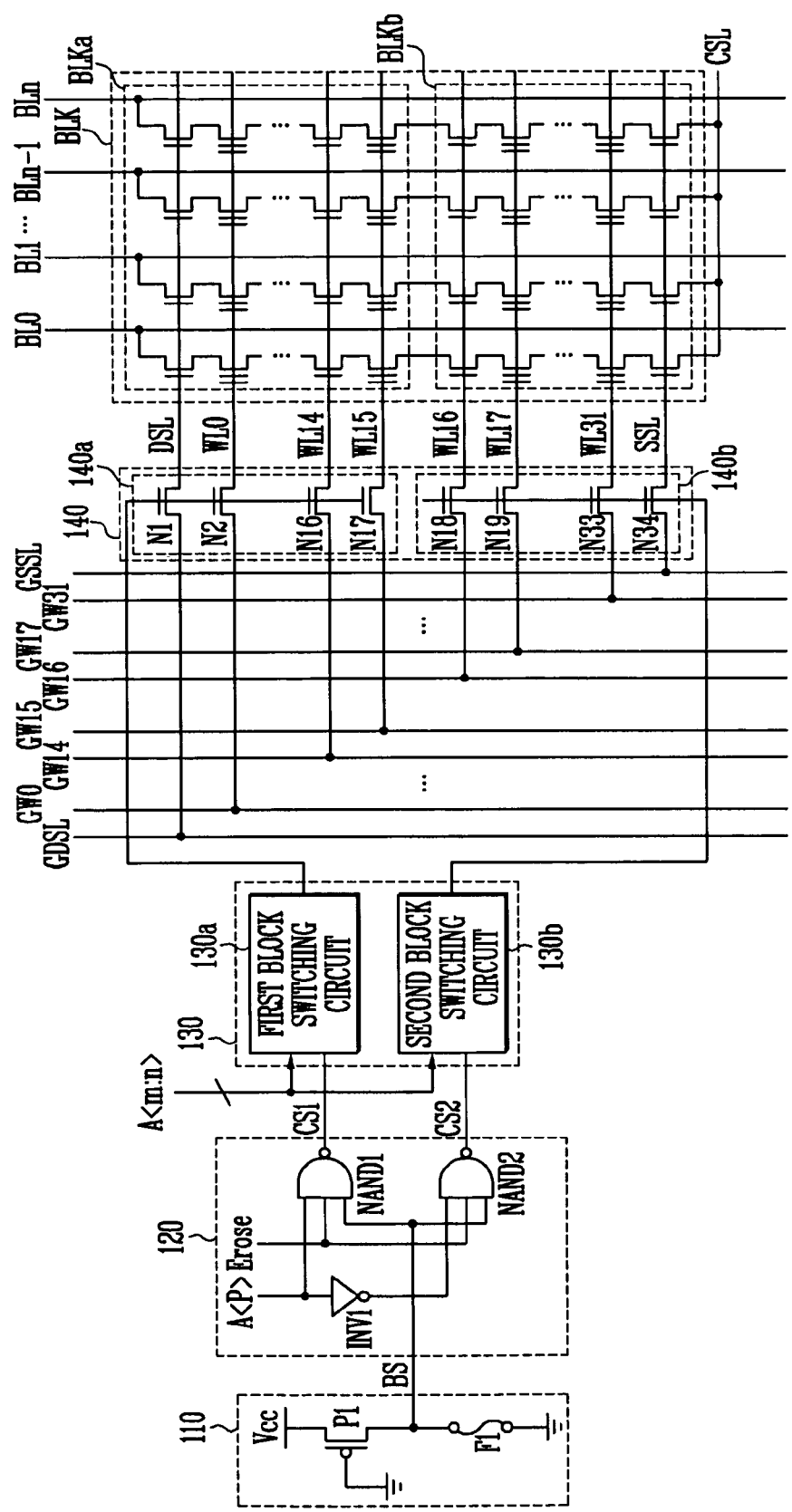
FIG. 1 is a circuit diagram of a NAND flash memory device according to one embodiment of the disclosure.

Referring to FIG. 1, a NAND flash memory device includes memory blocks BLK, a block division selector 110, a page group selection controller 120, first and second block switching circuits 130a and 130b, and a switching circuit 140.

The memory block BLK is provided with a plurality of blocks to form a memory array, while a corresponding (i.e., matching) number of the first and second block switching circuits 130a and 130b and the switching circuit 140 are provided. A first selection signal CS1 of the page group selection controller 120 is applied to all the first block switching circuits 130a arranged by the number of the memory blocks BLK, while a second selection signal CS2 of the page group selection controller 120 is applied to all the second block switching circuits 130b also arranged by the number of the memory blocks BLK.

The construction of the memory block BLK is now described in greater detail. The memory block BLK is divided into first and second page groups BLKa and BLKb. Hereinafter, it is assumed as an example that the memory block BLK includes 32 pages that are divided into two page groups of 16 pages. In this case, the first page group BLKa includes 16 pages connected to first through sixteenth wordlines WL0–WL15, and a drain selection line DSL as well. The second page group BLKb includes 16 pages connected to the seventeenth through thirty-second wordlines WL17–WL31, and a drain selection line SSL as well.

The switching circuit 140 includes first and second switching circuits 140a and 140b that respectively transfer operating voltages to the first and second page groups BLKa and BLKb. In more detail, the first switching circuit 140a includes a plurality of switching elements N1–N17 connected to the drain selection line DSL and the first through sixteenth wordlines WL0–WL15, transferring operating voltages from global lines GDSL and GW0–GW15 to the drain selection line DSL and the first through sixteenth wordlines WL0–WL15. The second switching circuit 140b includes a plurality of switching elements N18–N34 connected to the seventeenth through thirty-second wordlines WL16–WL31 and the source selection line SSL, transferring operating voltages from the global lines GW16–GW31 and GSSL to the seventeenth through thirty-second wordlines WL16–WL31 and the source selection line SSL.

In the structure, the memory block BLK is divided into the first and second page groups BLKa and BLKb in accordance with connecting states among the first and second switching circuits, 140a and 140b, and the wordlines WL0–WL31.

The block division selector 110 outputs a division signal BS in accordance with divisional operations of the memory block BLK. For instance, it determines to divide the memory block BLK in accordance with a cutting state of the fuse F1. For convenience in understanding only, an exemplary case of outputting the division signal BS at a high level is now described, for which the memory block BLK is regarded as being divided if the fuse F1 is cut off. In this case, the block division selector 110 may be implemented with a resistor element P1 and the fuse F1 connected between the power source voltage and the ground voltage terminals in series, in which a node connected to the resistor element P1 and the fuse F1 acts as an output node from which the division signal BS is generated. In the meantime, the resistor element P1 is connected between the power source voltage terminal and the output node, whose gate is coupled to the ground voltage terminal. The resistor element P1 may be implemented by a PMOS transistor having a predetermined on-resistance value.

The page group selection controller 120 outputs the first selection signals CS1 and CS2 in accordance with a page selection address signal A<p>, the division signal BS, and an erasing signal Erase. As the NAND flash memory device is operable with the unit of block only for an erasing operation, there is no need to divide the memory block BLK during the programming or erasing operation. Therefore, only when the erasing signal Erase is input thereto, the selection signal CS1 or CS2 is generated to select one of the page blocks BLKa and BLKb. In the meantime, the selection signals CS1 and CS2 are output with high levels to not divide the memory block BLK if the division signal BS is applied thereto in low level. Otherwise, if the division signal BS is set to a high level, an alternative one of the first and second selection signals CS1 and CS2 is generated at a high level.

Here, the page selection address A<p>, as one of the address signals supplied from an external source for page selection, is an address signal corresponding to the most significant bit in the address signals for page selection. According to a level of the page selection address signal A<p>, the first selection signal CS1 is output at a high level to select the first page group BLKa or the second selection signal CS2 is output at a high level to select the second page group BLKb.

The page group selection controller 120 includes a first NAND gate NAND1 outputting the first selection signal CS1 in accordance with the erasing signal Erase, the division signal BS, and the page selection address signal A<p>, an inverter INV1 inverting the page selection address signal A<p>, and a second NAND gate NAND2 outputting the second selection signal CS2 in accordance with the erasing signal Erase, the division signal BS, the page selection address signal A<p>, and the output signal of the inverter INV1.

The block selector 130 includes a pair of block switching circuits 130a and 130b, controlling the switching circuit 140 to transfer operating voltages to a specific memory block in response to the first and second selection signals CS1 and CS2. As shown in FIG. 1, the block switching circuits 130a and 130b are generally disclosed. More specifically, the pair of block switching circuits 130a and 130b are operative according to the block selection address signal A<m:n>. The first block switching circuit 130a controls the first switching circuit 140a of the switching circuit 140 in response to the first selection signal CS1, while the second block switching circuit 130b controls the second switching circuit 140b of the switching circuit 140 in response to the second selection signal CS2. For example, in the case that the memory block BLK is operating while being divided, if the first page group BLKa is selected by the first selection signal CS1, the first switching circuit 140a is exclusively conductive to transfer an operating voltage (e.g., the erasing voltage) to the first page group BLKa. Otherwise, if the second page group BLKb is selected by the second selection signal CS2, the second switching circuit 140b is exclusively conductive to transfer an operating voltage to the second page group BLKb.

The first and second block switching circuits 130a and 130b may be constructed in accordance with the same architecture, as described below in connection with the first block switching circuit 130a as an example.

Figure 2:
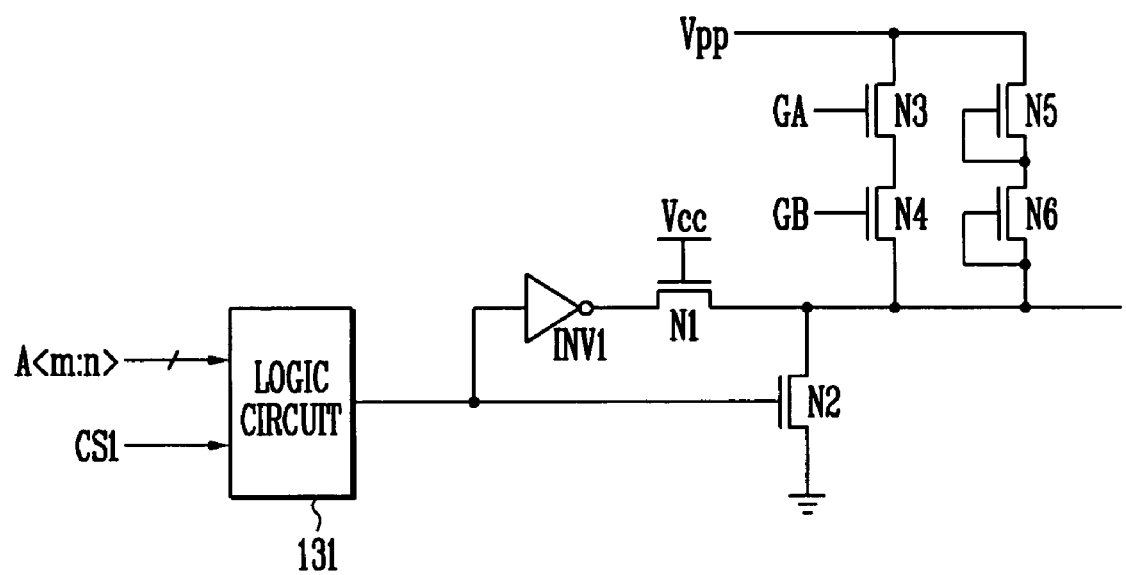
FIG. 2 is a circuit diagram of a block switching circuit of the NAND flash memory device shown in FIG. 1.

FIG. 2 is a circuit diagram of an exemplary block switching circuit for use in the NAND flash memory device shown in FIG. 1. In this embodiment, the block switching circuit includes a logic circuit 131 logically combining the block selection address signal A<m:n> and the first selection signal CS1, an inverter INV1 inversing an output signal of the logic circuit 131, a first NMOS transistor N1 connected between the inverter INV1 and an output terminal of the circuit and coupled to the power source voltage through a gate, a second NMOS transistor N2 connected between the output terminal and the ground voltage terminal and being operable in response to an output signal of the logic circuit 131, first and second diodes N5 and N6 serially connected between a high voltage terminal Vpp and the output terminal, and third and fourth NMOS transistors N3 and N4 connected between the high voltage terminal Vpp and the output terminal in series and responding to block selection signals GA and GB to designate memory blocks during a precharging operation.

The operation of the exemplary NAND flash memory device constructed as described above is now described in connection with programming/reading operations, erasing without memory block division, and erasing with memory block division.

In the programming or erasing operation, an erasing signal Erase is input at a low level, so that the first and second selection signals CS1 and CS2 are generated all at high levels regardless of a condition of the division signal BS of the block division selector 110. Responding to the high levels of the first and second selection signals CS1 and CS2, the first and second block switching circuits 130a and 130b activate all the first and second switching circuits 140a and 140b of the switching circuit 140.

As a result, a program or read voltage is transferred from the global lines GDSL, GW0–GW31, and GSSL to all of the lines DSL, WL0–WL31, and SSL of the memory block BLK. As a further result, the memory device is normally operable regardless of the division of the memory block during the programming or reading operation. In the NAND flash memory device, the programming or reading operation is conducted in the unit of page, so it is not necessary to divide the memory block BLK. On the other hand, the memory device is operable during an erasing operation. Described, hereinafter are a case of erasing without division of the memory block and a case of erasing with division of the memory block.

In an erasing operation without division of the memory block BLK, the fuse F1 of the block division selector 110 maintains its connection state. Thus, the block division selector 110 outputs the division signal BS at a low level.

The page group selection controller 120 outputs the first and second selection signals CS1 and CS2 all at high levels in response to the division signal BS at a low level. With the first and second selection signals CS1 and CS2 at high levels, the first and second block switching circuits 130a and 130b activate all of the first and second switching circuits 140a and 140b.

Accordingly, the erasing voltage provided via the global lines GDSL, GW0–GW31, and GSSL is transferred to all of the lines DSL, WL0–WL31, and SSL, conducting the erasing operation in the unit of block.

In an erasing operation with division of the memory block BLK, the fuse F1 of the block division selector 110 maintains its disconnected state. In other words, the fuse F1 is cut off with division of the memory block BLK. Accordingly, the block division selector 110 outputs the division signal BS at a high level.

The page group selection controller 120 outputs the first and second selection signals CS1 and CS2 in accordance with the high level of the division signal BS, the page selection address signal A<P>, and the erasing signal Erase. At this time, output levels of the first and second selection signals CS1 and CS2 are determined in accordance with the page selection address signal A<P> corresponding to the most significant bit of the address signal used in selecting a page among plural pages included in the memory block BLK.

For example, when the page selection address signal A<P> is set at a low level, the first and second selection signals CS1 and CS2 are generated at high levels. Via the selection signals, the first block switching circuit 130a activates the first switching circuit 140a, while the second block switching circuit 130b inactivates the first switching circuit 140a. In other words, the first switching circuit 140a operates exclusively. Thus, the erasing voltage provided from the global lines GDSL and GW0–GW15 is transferred only to the first page group BLKa of the memory block BLK, erasing memory cells only included in the first page group BLKa. The erasing operation is carried out in the unit of page group smaller than the block unit.

Otherwise, when the page selection address signal A<P> is set at a high level, the first selection signal CS1 is generated at a low level while the second selection signal is generated at a high level. Via the selection signals, the first block switching circuit 130a inactivates the first switching circuit 140a, while the second block switching circuit 130b activates the first switching circuit 140a. In other words, the second switching circuit 140b operates exclusively. Thus, the erasing voltage provided from the global lines GW16–GW31 and GSSL is transferred only to the second page group BLKb of the memory block BLK, erasing memory cells only included in the second page group BLKa. The erasing operation is carried out in the unit of page group smaller than the block unit.

As described above, the NAND flash memory device is advantageous in easily changing a block size by dividing all memory blocks into two page groups, each memory block being comprised of two block switches to select each page group in response to an external address signal, and during an erasing operation, applying an erasure voltage to one or two page groups.

Although the disclosed NAND flash memory device has been described in connection with a number of embodiments, it is not limited thereto. It will be apparent to those skilled in the art that various substitutions, modifications and changes may be made thereto without departing from the scope and spirit of the appended claims.

What is claimed is:

1. A NAND flash memory device comprising:
   a memory block divided into first and second page groups;
   first and second switching circuits connected between the first and second page groups and a global line to transfer operating voltages to the first and second page groups, respectively;
   a block division selector to output a division signal to determine whether to activate one or both of the first and second page groups;
   a page group selection controller to output first and second selection signals at a same level or at different levels in response to a page selection address signal and an erasing signal; and
   first and second block switching circuits to control the first and second switching circuits in response to the first and second selection signals, respectively, and a block selection address signal,
   wherein, in accordance with the division signal, all memory cells included in the memory block are erased, or memory cells included in the first or second page group are independently erased.

2. The NAND flash memory device as set forth in claim 1, wherein the first and second switching circuits and the first and second block switching circuits are provided with a corresponding number of respective memory blocks.

3. The NAND flash memory device as set forth in claim 1, wherein the first page group includes a drain selection line and first through sixteenth wordlines, and wherein the second page group includes seventeenth through thirty-second wordlines and a source selection line.

4. The NAND flash memory device as set forth in claim 1, wherein the page selection address signal corresponds to the most significant bit to select a page of the memory block.

5. The NAND flash memory device as set forth in claim 1, wherein the first switching circuit includes a plurality of switching elements controlled by the first block switching circuit, each of which is connected to a drain selection line and first through sixteenth wordlines, included in the first page group, and transferring an operating voltage from the global line to the drain selection line and the first through sixteenth wordlines.

6. The NAND flash memory device as set forth in claim 1, wherein the second switching circuit includes a plurality of switching elements controlled by the second block switching circuit, each of which is connected to first through sixteenth wordlines and a source selection line, included in the second page group, and transferring an operating voltage from a global line to the first through sixteenth wordlines and the source selection line.

7. The NAND flash memory device as set forth in claim 1, wherein the block division selector includes a resistor element and a fuse that are connected between a power source voltage terminal and a ground voltage terminal in series, the division signal being output from a node connected to the resistor element and the fuse.

8. The NAND flash memory device as set forth in claim 7, wherein a cut-off state of the fuse determines whether to activate one or both of the first and second page groups.

9. The NAND flash memory device as set forth in claim 7, wherein the resistor element is connected between the power source voltage terminal and the fuse, and has a gate connected to the ground voltage terminal, the resistor element comprising a PMOS transistor having a predetermined on-resistance value.

10. The NAND flash memory device as set forth in claim 1, wherein the page group selection controller comprises:
    a first NAND gate to output the first selection signal in accordance with the erasing signal, the division signal, and the page selection address signal;
    an inverter to invert the page selection address signal; and
    a second NAND gate to output the second selection signal in accordance with the erasing signal, the division signal, and a signal generated by the inverter.

11. The NAND flash memory device as set forth in claim 1, wherein the first block switching circuit comprises:
    a logic circuit to logically combine the block selection address signal and the first selection signal;
    an inverter to an output signal of the logic circuit;
    a first NMOS transistor connected between the inverter and an output terminal to receive a power source voltage through a gate;
    a second NMOS transistor connected between the output terminal and a ground voltage terminal and responsive to the output signal of the logic circuit;
    third and fourth NMOS transistors connected between the output terminal and a high voltage terminal in series, each of which receives a block selection signal to select the memory block during a precharging operation; and
    first and second diodes connected between the high voltage terminal and the output terminal in series.

12. The NAND flash memory device as set forth in claim 1, wherein the second block switching circuit comprises:
    a logic circuit to logically combine the block selection address signal and the second selection signal;
    an inverter to invert an output signal of the logic circuit;
    a first NMOS transistor connected between the inverter and an output terminal to receive a power source voltage through a gate;
    a second NMOS transistor connected between the output terminal and a ground voltage terminal and responsive to the output signal of the logic circuit;
    third and fourth NMOS transistors connected between the output terminal and a high voltage terminal in series, each of which receives a block selection signal to select the memory block during a precharging operation; and
    first and second diodes connected between the high voltage terminal and the output terminal in series.

* * * * *